(12) United States Patent
Shiota et al.

(10) Patent No.: US 7,632,612 B2
(45) Date of Patent: Dec. 15, 2009

(54) HALFTONE PHASE SHIFT MASK BLANK, HALFTONE PHASE SHIFT MASK, AND METHOD OF PRODUCING THE SAME

(75) Inventors: Yuuki Shiota, Akishima (JP); Osamu Nozawa, Fuchu (JP); Ryo Ohkubo, Akishima (JP); Hideaki Mitsui, Fuchu (JP)

(73) Assignee: Hoya Corporation, Tokyo (JP)

( * ) Notice: Subject to any disclaimer, the term of this patent is extended or adjusted under 35 U.S.C. 154(b) by 495 days.

(21) Appl. No.: 11/478,687

(22) Filed: Jul. 3, 2006

(65) Prior Publication Data

US 2007/0082278 A1    Apr. 12, 2007

Related U.S. Application Data

(62) Division of application No. 10/370,776, filed on Feb. 24, 2003, now Pat. No. 7,115,341.

(30) Foreign Application Priority Data

Feb. 22, 2002 (JP) ............................... 47051/2002
Mar. 22, 2002 (JP) ............................... 82021/2002

(51) Int. Cl.
*G03F 1/00* (2006.01)
(52) U.S. Cl. ......................................................... 430/5
(58) Field of Classification Search ................ 430/5, 430/323; 428/209, 210; 216/58, 75
See application file for complete search history.

(56) References Cited

U.S. PATENT DOCUMENTS

| 5,284,724 | A | 2/1994 | Noelscher et al. |
| 5,679,484 | A | 10/1997 | Ito et al. |
| 5,935,735 | A | 8/1999 | Okubo et al. |
| 5,942,356 | A | 8/1999 | Mitsui et al. |

(Continued)

FOREIGN PATENT DOCUMENTS

DE    101 64 189 A1    8/2002

(Continued)

OTHER PUBLICATIONS

Chinese Office Action dated Jan. 23, 2009.

*Primary Examiner*—Stephen Rosasco
(74) *Attorney, Agent, or Firm*—Sughrue Mion, PLLC

(57) ABSTRACT

A halftone phase shift mask blank for use in manufacturing a halftone phase shift mask comprises a transparent substrate, a light transmitting portion formed on the substrate for transmitting an exposure light beam, a phase shifter portion formed on the substrate for transmitting a part of the exposure light beam as a transmitted light beam and for shifting a phase of the transmitted light beam by a predetermined amount, and a phase shifter film for forming the phase shifter portion. The halftone phase shift mask has an optical characteristic such that light beams passing through the light transmitting portion and through the phase shifter portion cancel each other in the vicinity of a boundary portion therebetween, thereby maintaining and improving an excellent contrast at a boundary portion of an exposure pattern to be transferred onto the surface of an object to be exposed. The phase shifter film comprises a film containing silicon, oxygen, and nitrogen as main components and an etching stopper film formed between the film and transparent substrate.

5 Claims, 8 Drawing Sheets dry etching ($Cl_2 + O_2$)

dry etching ($C_2F_6$)

U.S. PATENT DOCUMENTS

| | | |
|---|---|---|
| 6,451,489 B1 | 9/2002 | Kaneko |
| 6,743,553 B2 | 6/2004 | Shiota et al. |
| 6,869,736 B2 | 3/2005 | Nakagawa et al. |
| 2001/0005564 A1 | 6/2001 | Motonaga et al. |
| 2002/0122991 A1 | 9/2002 | Shiota et al. |

FOREIGN PATENT DOCUMENTS

| | | |
|---|---|---|
| JP | 2-39153 | 2/1990 |
| JP | 4-136854 A | 5/1992 |
| JP | 4-140635 | 5/1992 |
| JP | 6-83034 | 3/1994 |
| JP | 7-104457 | 4/1995 |
| JP | 7-168343 | 7/1995 |
| JP | 7-209849 | 8/1995 |
| JP | 8-76353 | 3/1996 |
| JP | 8-325560 | 12/1996 |
| JP | 10-198017 | 7/1998 |
| JP | 2001-56545 | 2/2001 |
| JP | 2001-66756 | 3/2001 |
| JP | 2001-174973 | 6/2001 |
| JP | 2001-337436 | 12/2001 |
| KR | 1998-33168 A | 7/1998 |
| KR | 10-190358 B1 | 1/1999 |
| KR | 2001-30448 A | 4/2001 |
| WO | WO 2002-21210 | 3/2002 | dry etching (Cl$_2$)

removal of resist dry etching (C$_2$F$_6$)

dry etching (Cl$_2$+O$_2$)

dry etching (C$_2$F$_6$)

dry etching (Cl$_2$)

removal of Cr film dry etching (Cl$_2$+O$_2$)

dry etching (C$_2$F$_6$)

dry etching (Cl$_2$)

removal of Cr film though the shortened exposure wavelength improves the# HALFTONE PHASE SHIFT MASK BLANK, HALFTONE PHASE SHIFT MASK, AND METHOD OF PRODUCING THE SAME This is a divisional of application Ser. No. 10/370,776 filed Feb. 24, 2003 now U.S. Pat. No. 7,115,341. The entire disclosure(s) of the prior application(s), application number(s) 10/370,776 is hereby incorporated by reference.

BACKGROUND OF THE INVENTION

The present invention relates to a halftone phase shift mask blank, a halftone phase shift mask, and a method of producing the same and, particularly, to a halftone phase shift mask blank suitable for use in a next-generation short-wavelength exposure light source such as an ArF excimer laser (193 nm) and an $F_2$ excimer laser (157 nm).

For a dynamic random access memory (DRAM), mass production of 256 Mbit products has been established at present and a higher integration from a Mbit level to a Gbit level is making a progress. Following the development of higher integration, a design rule of an integrated circuit becomes finer. It is only a matter of time before a fine pattern with a line width (half pitch) of 0.10 µm or less is required.

As one approach to adapt for miniaturization of the pattern, a resolution of the pattern has been improved by shortening a wavelength of an exposure light source. As a result, a KrF excimer laser (248 nm) and an ArF excimer laser (193 nm) are mainly used as the exposure light source in the existing photolithography.

Although the shortened exposure wavelength improves the resolution, the depth of focus becomes shallow. This results in adverse influences, such as an increase in load imposed on a design of an optical system including a lens and decrease in stability of a process.

In order to solve the above-mentioned problems, a phase shift method has become used. In the phase shift method, a phase shift mask is used as a mask for transferring the fine pattern.

The phase shift mask comprises, for example, a phase shifter portion which forms a patterned portion on the mask, and an unpatterned portion in which the phase shifter portion does not exist. With this structure, light beams transmitted through both of the phase shifter portion and the unpatterned portions are shifted in phase by 180° with respect to each other to cause mutual interference of the light beams in a pattern boundary area. In this manner, contrast of a transferred image is improved.

It is known that a phase shift amount φ (rad) of the light beam passing through the phase shifter portion depends on a real part n of a complex refractive index and a film thickness d of the phase shifter portion and that the relationship given by the following equation (1) is established.

$$\varphi = 2\pi d(n-1)/\lambda \quad (1)$$

Here, λ denotes a wavelength of an exposure light beam. Therefore, in order to shift the phase by 180°, the film thickness d is given by:

$$d = \lambda/\{2(n-1)\} \quad (2)$$

The above-mentioned phase shift mask achieves an increase in depth of focus sufficient to obtain a desired resolution. It is therefore possible to improve both of the resolution and the applicability of the process without changing the exposure wavelength.

Practically, the phase shift mask is generally classified into a perfect transmission (Levenson type) phase shift mask and a halftone phase shift mask in accordance with a light transmission property of the phase shifter portion forming the mask pattern. In the former, the phase shifter portion has a light transmittance equivalent to that of the unpatterned portion (light transmitting portion). Thus, the former is a mask substantially transparent to the exposure wavelength and is generally effective in transfer of a line and space pattern.

On the other hand, in the latter, i.e., the halftone type, the phase shifter portion (light semi-transmitting portion) has a light transmittance on the order of about several percentages to several tens of percentages of that of the unpatterned portion (light transmitting portion). It is understood that this type is effective in preparation of a contact hole or an isolated pattern.

The halftone phase shift mask includes a double-layer type halftone phase shift mask comprising a layer for mainly adjusting the transmittance and another layer for mainly adjusting a phase; and a single-layer type halftone phase shift mask which is simple in structure and easy in manufacture.

At present, the single-layer type is a mainstream because it is easy in processing. In most cases, the halftone phase shifter portion comprises a single-layer film of MoSiN or MoSiON.

On the other hand, in the double-layer type, the halftone phase shifter portion comprises a combination of the layer for mainly controlling the transmittance and the layer for mainly controlling the phase shift amount. It is possible to independently control a spectral characteristic represented by the transmittance and the phase shift amount (phase angle).

On the other hand, with the miniaturization of an LSI pattern, it is expected that the wavelength of the exposure light source (exposure wavelength) will be shortened from the existing KrF excimer laser (248 nm) to the ArF excimer laser (193 nm) and further to the $F_2$ excimer laser (157 nm) in future.

In the existing halftone phase shift mask, a film is typically designed so that the halftone phase shifter portion has an exposure light transmittance around 6%. However, in anticipation of a higher resolution, a higher transmittance is desired. In future, a transmittance of 15% or more will be required.

With the pursuit of the shortened wavelength of the exposure light source and the higher transmittance, the range of selection of a material of the halftone phase shifter portion which satisfies a predetermined transmittance and a predetermined phase shift amount tends to be narrowed. Moreover, with the increase in transmittance, a material having a high transmittance is required. Furthermore, with the shortening of the wavelength of the exposure light source, the material having a high transmittance is necessary as compared with the wavelength previously used. These requirements cause a problem that etching selectivity with a quartz substrate during patterning is reduced.

In the halftone phase shifter portion of a multilayered structure comprising two or more layers, a phase difference and a transmittance can be controlled by a combination of multilayered or double-layer films. It is therefore easy to select the material. Furthermore, a material which serves as an etching stopper of an upper layer can be selected as a lower layer.

In the phase shift mask, a reflectance in the exposure light beam must be reduced to some extent. Generally, in a step of inspecting the appearance of the pattern, a light beam longer in wavelength than the exposure wavelength is used as an inspection wavelength and a transmission type defect inspection apparatus (e.g., KLA300 series, and the like) is used. Therefore, if the transmittance is excessively high (e.g., 40% or more) with respect to the inspection wavelength (for example, if the exposure wavelength is 248 nm (KrF excimer laser), the inspection wavelength is 488 nm or 364 nm), the inspection is difficult to perform.

Especially, with the shortened exposure wavelength, the halftone phase shifter portion having a high transmittance is required as described above. However, the material having a high transmittance tends to be large in increasing ratio of the transmittance with respect to the change in wavelength towards a longer wavelength. Therefore, in the single-layer halftone phase shifter, it is further difficult to reduce the transmittance with respect to the inspection wavelength to a predetermined range.

Furthermore, in the defect inspection apparatus, development of a new inspection method using transmitted and reflected light beams has been made. If the inspection is carried out in this method, the transmittance in the inspection wavelength may be slightly high (e.g., 50 to 60%) as compared with the inspection using the transmitted light. However, it is necessary to control the reflectance in the inspection wavelength so that the reflectance has some difference (e.g., 3% or more) from that of a transparent substrate.

Under the above-mentioned situation, the use of the halftone phase shifter portion of the multilayered type including two or more layers makes it easy to control reflection and transmission characteristics in the exposure and inspection light beams.

The double-layer halftone phase shift mask is described, for example, in Japanese Unexamined Patent Publication No. H4-136854 in which the halftone phase shifter portion has a double-layer structure comprising a thin Cr layer and a coating glass (Prior-art Example 1).

It is known that the halftone phase shifter portion of a multilayered structure can be prepared by the use of a single common apparatus and a single common etchant for etching. For example, Japanese Unexamined Patent Publication No. H6-83034 discloses a mask including a halftone phase shifter portion having a multilayered structure in which the same element is contained in a plurality of layers (e.g., a double-layer structure comprising Si and SiN layers) (Prior-art Example 2).

Furthermore, the technique for reducing the transmittance with respect to the inspection wavelength is described in Japanese Unexamined Patent Publication No. H7-168343. Specifically, a double-layer structure includes a single-layer film known as a single-layer type halftone phase shifter, such as MoSiO or MoSiON, and a transmission film low in wavelength dependency of the transmittance in combination with the single-layer film. With this structure, a desired transmittance can be obtained with respect to both the exposure light beam (KrF excimer laser) and the inspection light beam (488 nm) (Prior-art Example 3).

Furthermore, a mask having the phase shifter portion of a multilayered structure using a tantalum-silicide-based material is described in Japanese Unexamined Patent Publication No. 2001-174973. Specifically, the halftone phase shifter portion has a double-layer structure which includes an upper layer containing tantalum, silicon, and oxygen as main components and a lower layer containing tantalum as a main component and not containing silicon (Prior-art Example 4).

Furthermore, Japanese Unexamined Patent Publication No. 2001-337436 discloses a mask including the halftone phase shifter portion having a double-layer structure which includes an upper layer containing tantalum, silicon, and oxygen as main components and a lower layer containing chromium and chromium-tantalum alloy as main components (Prior-art Example 5).

However, the above-described prior-art examples have the following problems.

Generally, a halftone phase shifter film is provided with a light shielding Cr layer formed thereon. The light shielding Cr layer serves as an etching mask layer for the halftone phase shifter film and is subsequently used to form a light shielding portion at a desired position on the mask.

In the structure of coating glass/thin Cr layer/glass substrate as in the Prior-art Example 1, the light shielding Cr layer is formed on the coating glass. In this event, preparation is made of a mask pattern of a three-layer structure of light shielding Cr layer/coating glass/thin Cr layer with a resist pattern, generally used in patterning, transferred thereon. Thereafter, the light shielding Cr layer is selectively removed typically by wet etching.

However, since the light shielding Cr layer is same in material with the thin Cr layer, there is a problem that the thin Cr layer is affected in the selective removing process of the light shielding Cr layer. Specifically, the thin Cr layer is etched and the pattern is sometimes completely removed in the principle similar to that of lift-off. When the thin Cr layer is side-etched, the transmittance in the vicinity of a pattern edge will inevitably be changed.

Next, in Prior-art Example 2, it is possible to continuously deposit, for example, the Si and the SiN layers by the use of the same sputtering apparatus and the same target of Si. However, if the SiN layer is deposited by reactive sputtering using the Si target and a sputtering atmosphere containing nitrogen, poisoning of the target by the reactive sputtering is caused to occur. As a result, reproducibility cannot be attained and productivity is decreased. Furthermore, with the use of SiN, the transmittance becomes excessively low with the shortening of the exposure wavelength in recent years.

Next, in Prior-art Example 3, MoSiO or MoSiON is used as the material of the single-layer film (upper layer). However, by inclusion of the metal, the transmittance is reduced. Therefore, this example is not suitable for the recent shortening of the exposure wavelength. Moreover, if the content of the metal is reduced, the refractive index is reduced so that the film thickness of the halftone phase shifter increases. This is disadvantageous for the fine processing.

Furthermore, in Prior-art Examples 4 and 5, TaSiO is used as the material of the upper layer. However, by inclusion of the metal, the transmittance is reduced. Therefore, these examples are not suitable for the recent shortening of the exposure wavelength. Moreover, if the content of the metal is reduced, the refractive index is reduced so that the film thickness of the halftone phase shifter increases. This is disadvantageous for the fine processing.

Moreover, in these prior-art examples, the lower layer serves as an etching stopper against dry etching of the upper layer using a fluorine-based gas. Thereafter, the lower layer is etched by dry etching using a chlorine-based gas.

However, the lower layer containing tantalum in the Prior-art Example 4 has an insufficient etching selectivity with respect to the fluorine-based dry etching of the upper layer. In case of the chromium-tantalum alloy in the Prior-art Example 5, an etching rate with the chlorine-based gas is slow and a high-accuracy pattern is not obtained.

SUMMARY OF THE INVENTION

It is therefore an object thereof to provide a halftone phase shift mask blank and a halftone phase shift mask superior in fine processability during etching for forming a halftone phase shifter portion.

It is another object of the present invention to provide a halftone phase shift mask blank and a halftone phase shift mask which can be used under a high transmittance (transmittance of 8 to 30%) in case where an exposure light source is shortened in wavelength, especially, in an exposure wavelength region of 140 nm to 200 nm, specifically, in the vicinity of 157 nm as the wavelength of an $F_2$ excimer laser and in the vicinity of 193 nm as the wavelength of an ArF excimer laser.

According to the present invention, there is provided a halftone phase shift mask blank in which a phase shifter film comprises a film containing silicon, oxygen, and nitrogen as main components and an etching stopper film formed between the film and a transparent substrate.

In the present invention, in halftone phase shifter layers formed on the transparent substrate, a film adjacent to the transparent substrate is referred to as a lower layer and a film formed on the lower layer is referred to as an upper layer.

Based on the facts that $SiN_x$ has a high irradiation resistance against the exposure light beam and a high chemical resistance against a cleaning liquid or the like because Si—N bond contributes to denseness of a matrix of a film and that $SiO_x$ has a relatively high transmittance even on a short wavelength side, the present inventors have focused their attention to $SiO_xN_y$ which utilizes merits of both of these materials.

Furthermore, the present inventors have found out that, by controlling the composition of $SiO_xN_y$, it is possible to obtain a phase shifter film suitable for use with the exposure light beam having a short wavelength. Furthermore, the present inventors have found out that the halftone phase shifter film having a double-layer structure of an $SiO_xN_y$ film (upper layer) and an etching stopper film (lower layer) is excellent not only in exposure light irradiation resistance and chemical resistance but also in processability of a pattern.

Herein, the etching stopper film is a film made of a material having a function of inhibiting the progress of etching of the $SiO_xN_y$ film, having a function of facilitating detection of an etching end point of the phase shifter film, or having both of the above-mentioned functions.

The upper layer is made of a material substantially consisting of silicon, oxygen, and nitrogen. That is, the upper layer comprises a film containing silicon, oxygen, and nitrogen as main components. This material is advantageous in the following respects. Specifically, even if the exposure light beam has a shortened wavelength, a desired transmittance and a phase difference can be controllably achieved in combination with the lower layer. In addition, the irradiation resistance against the exposure light beam and the chemical resistance against the cleaning liquid or the like are high. Furthermore, since a relatively high refractive index can be obtained, it is possible to suppress the total film thickness of the halftone phase shifter film sufficient to obtain a desired phase difference. Therefore, the fine processability of the halftone phase shifter film is superior.

For the above-mentioned material of the upper layer, it is preferable to adjust and control a complex refractive index real part n to a value within a range of $n \geq 1.7$ and a complex refractive index imaginary part k to a value within a range of $k \leq 0.450$. These ranges are advantageous in achieving desired optical characteristics of the halftone phase shift mask following the shortening of the wavelength of the exposure light beam. For the $F_2$ excimer laser, the range of $k \leq 0.40$ is preferable and the range of $0.07 \leq k \leq 0.35$ is more preferable.

For the ArF excimer laser, the range of $0.10 \leq k \leq 0.45$ is preferable. For the $F_2$ excimer laser, the range of $n \geq 2.0$ is preferable and the range of $n \geq 2.2$ is more preferable. For the ArF excimer laser, the range of $n \geq 2.0$ is preferable and the range of $n \geq 2.5$ is more preferable.

In order to obtain the above-described optical characteristics, the contents of the above-mentioned components are selected as follows. The content of silicon is 35 to 45 atomic %, the content of oxygen is 1 to 60 atomic %, and the content of nitrogen is 5 to 60 atomic %. If the content of silicon is greater than 45% or if the content of nitrogen is greater than 60%, the transmittance of the film becomes insufficient. Conversely, if the content of nitrogen is less than 5% or if the content of oxygen exceeds 60%, the transmittance of the film is too high and, therefore, the function of the halftone phase shifter film is lost. If the content of silicon is less than 35% or if the content of nitrogen exceeds 60%, the structure of the film physically and chemically becomes very unstable.

From the similar viewpoint, the contents of the above-mentioned components are preferably selected as follows for the $F_2$ excimer laser. The content of silicon is 35 to 40 atomic %, the content of oxygen is 25 to 60 atomic %, and the content of nitrogen is 5 to 35 atomic. Similarly, the contents of the above-mentioned components are preferably selected as follows for the ArF excimer laser. The content of silicon is 38 to 45 atomic %, the content of oxygen is 1 to 40 atomic %, and the content of nitrogen is 30 to 60 atomic %. In addition to the above-mentioned components, a small amount of impurities (metal, carbon, fluorine, and the like) may also be contained.

The upper layer in the present invention can be deposited by reactive sputtering using a target substantially comprising silicon and a sputtering atmosphere using a reactive gas containing a rare gas, nitrogen, and oxygen. The target substantially comprising silicon is high in number density and purity and is therefore stable as compared with the case where a mixed target such as metal silicide is used. Accordingly, there is an advantage that a particle generation ratio of the resultant film is reduced.

The etching stopper layer comprises a film made of a material having a function of inhibiting the progress of etching of the $SiO_xN_y$ film, having a function of facilitating detection of an etching end point of the phase shifter film, or having both of the above-mentioned functions.

Preferably, the film having a function of inhibiting the progress of etching of the $SiO_xN_y$ film is made of a material having a low selectivity with respect to etching of the phase shifter layer, that is, a material having an etching rate lower than that of the $SiO_xN_y$ film with respect to an etching medium used in etching of the $SiO_xN_y$ film. Specifically, it is desired that the film is made of a material which has an etching selectivity of 0.7 or less, preferably 0.5 or less.

On the other hand, the latter etching stopper film having a function of facilitating detection of an etching end point of the phase shifter film is a film made of a material in which the difference in reflectance for an etching end point detection light beam (e.g., 680 nm) between the transparent substrate (e.g., the synthetic quartz substrate) and the etching stopper is greater than that between the transparent substrate and the $SiO_xN_y$ film.

Preferably, the material has a refractive index (the real part of the complex refractive index) higher than those of the $SiO_xN_y$ film and the transparent substrate. Preferably, the etching stopper film is made of a material in which the difference in refractive index for the wavelength of the etching end point detection light beam between the etching stopper film and the $SiO_xN_y$ film is 0.5 or more, preferably 1 or more and in which the difference in refractive index between the etching stopper film and the transparent substrate is 0.5 or more, preferably 1 or more.

It is desired that the etching stopper layer has an etching selectivity of 1.5 or more, preferably 2.0 or more. Specifically, if the etching stopper layer cannot be removed, the transmittance in a light transmitting portion decreases so that a contrast upon pattern transfer is deteriorated. Even if the layer can be removed, the substrate might be etched in the vicinity of the etching end point unless the etching rate of the etching stopper layer is greater than that of the substrate. As a result, the processing accuracy is deteriorated.

Taking the aforementioned respects into account, use is suitably made of a single kind of material or two or more kinds of materials selected from a group including magnesium, aluminum, titanium, vanadium, chromium, yttrium, zirconium, niobium, molybdenum, tin, lanthanum, tantalum, tungsten, silicon, and hafnium, as well as a compound (oxide, nitride, nitric oxide) thereof, and so on.

The etching stopper film preferably has a film thickness falling within a range of 10 to 200 angstroms. If the thickness is smaller than 10 angstroms, etching cannot completely be inhibited and a significant change in reflectance cannot be detected. This may results in degradation in pattern processing accuracy.

On the other hand, expansion of the pattern by the progress of isotropic etching may reach about twice the film thickness at maximum, depending upon the etching process. Therefore, if the film thickness exceeds 200 angstroms when a pattern line width of 0.1 μm (=1000 angstroms) or less is processed, a dimensional error of 40% or more is produced. In this event, the quality of the mask is seriously adversely influenced.

Preferably, the etching stopper layer has a function of adjusting the transmittance. The transmittance of the etching stopper layer itself with respect to the exposure wavelength (140 to 200 nm, around 157 nm, or around 193 nm) is selected between 3 and 40%. Thus, the transmittance in the phase shifter portion is maintained and the transmittance for the inspection wavelength longer than the exposure wavelength can be reduced by the etching stopper layer formed at a lower part of the phase shifter portion (by lamination of a different material).

Specifically, inspection of the mask in a manufacturing process is presently carried out by the use of an inspection light beam having a wavelength longer than the exposure wavelength and measuring the transmitted light strength. The transmittance of a semi-transmitting portion (phase shifter portion) is preferably 40% or less within the range of 200 to 300 nm as the inspection wavelength presently used. Specifically, if the transmittance is 40% or more, a contrast from the transmitting portion is not sufficient and an inspection accuracy becomes low. In case where the etching stopper film is made of a material having a high light shielding function, the etching stopper film may be made of a single kind of material or two or more kinds of materials selected from a group including aluminum, titanium, vanadium, chromium, zirconium, niobium, molybdenum, lanthanum, tantalum, tungsten, silicon, and hafnium, as well as nitride thereof.

Preferably, the etching stopper layer has a film thickness sufficiently smaller than that of the phase shifter portion. Specifically, a film thickness of 200 angstroms or less is appropriate. If the thickness exceeds 200 angstroms, it is highly possible that the transmittance at the exposure wavelength is lower than 3%. In this case, the phase angle and the transmittance are adjusted by the two layers of the $SiO_xN_y$ film and the etching stopper film.

Preferably, the transmittance of the etching stopper layer itself with respect to the exposure wavelength (140 to 200 nm, around 157 nm, or around 193 nm) is selected to be 3 to 40% and the transmittance is adjusted to be 3 to 40% when the etching stopper layer is laminated with the $SiO_xN_y$ film. In case where the etching stopper layer is provided, the etching stopper layer exposed on the surface of a portion corresponding to the light transmitting portion must be removable. This is because, if the light transmitting portion is covered with the etching stopper layer, the transmittance of the light transmitting portion decreases.

In order to remove the etching stopper film, use must be made of a method different from etching of the $SiO_xN_y$ film in case where the etching stopper film is made of a material having a function of inhibiting the progress of etching of the $SiO_xN_y$ film. In case where the etching stopper film is made of a material having a function of facilitating detection of the etching end point of the phase shifter film, etching of the $SiO_xN_y$ film and etching of the etching stopper film may be carried out by the same method or by different methods.

The phase shifter film made of the $SiO_xN_y$ film can be etched by dry etching (RIE: Reactive Ion Etching) using a fluorine-based gas such as $CHF_3$, $CF_4$, $SF_6$, and $C_2F_6$ and a mixed gas thereof. On the other hand, in case where the etching stopper film is etched and removed in a method different from that for the phase shifter film, use may be made of dry etching using a fluorine-based gas different from that used in removing the phase shifter film, dry etching using a chlorine-based gas such as $Cl_2$ and $Cl_2+O_2$, or wet etching using acid, alkali, or the like.

As the etching stopper film removable by the fluorine-based dry etching same as the etching of the phase shifter film of the $SiO_xN_y$ film, use may made of a material such as silicon, $MoSi_x$, $TaSi_x$, $WS_x$, $CrSi_x$, $ZrSi_x$, and $HfSi_x$.

In case where the etching stopper film which can be etched continuously with the $SiO_xN_y$ film is provided as described above, the merit in the manufacturing process is large. As the etching stopper film which can be etched by a method different from that of the etching of the phase shifter film comprising the $SiO_xN_y$ film, use is preferably made of a thin film containing Ta (for example, a thin film of Ta, $TaN_x$, $TaZr_x$, $TaCr_x$, or $TaHf_x$), a thin film containing Zr, or a thin film containing Hf, which can be etched by dry etching using $Cl_2$. Alternatively, use may preferably be made of a thin film containing Cr which can be etched by dry etching using $Cl_2+O_2$.

In case where the etching stopper film is made of the material having a function of inhibiting the progress of etching of the $SiO_xN_y$ film and having a high transmittance, the etching stopper film may be disposed between the transparent substrate and the light semi-transmitting film of the above-described halftone phase shift mask having a single-layer structure. In this structure, the etching stopper exposed on the light transmitting portion need not be removed.

The etching stopper layer is particularly effective in case where the $SiO_xN_y$ film contains 40 atomic % or more oxygen or in case where the difference in refractive index from the transparent substrate is 0.5 or less, preferably 0.3 or less.

Moreover, the present inventors have found out a predetermined material for the lower layer, which is resistant against the fluorine-based gas and which can be etched by dry etching using a gas (e.g., the chlorine-based gas) different from the fluorine-based gas in case where the upper layer is etched by dry etching using the fluorine-based gas.

First, the predetermined material may be a single metal selected from a first group consisting of Al, Ga, Hf, Ti, V, and Zr or a material (an alloy or any other mixture) containing two or more kinds of these metals (the material will hereinafter be referred to as a first material). The single metal selected from the first group or the first material is a material which is resistant against the fluorine-based gas and which can be etched by dry etching using a gas (e.g., a chlorine-based gas) different from the fluorine-based gas.

The single metal selected from the first group or the first material is a material which has a high etch resistance in the dry etching using the fluorine-based gas and which can easily be etched using the gas (e.g., chlorine-based gas, bromine-based gas, iodine-based gas, or the like) different from the fluorine-based gas.

The lower layer is required to have a resistance against the dry etching using the fluorine-based gas to the extent that the effect as the etching stopper layer for the upper layer is obtained. The etching rate of the material of the lower layer is preferably between 0 and several tens of angstroms/min, although it depends upon the thickness of the lower layer and the etching rate ratio (hereinafter referred to as the selectivity) with respect to the upper layer. Preferably, the material can be etched and removed in the dry etching of the lower layer using the chlorine-based gas to the extent allowable in a desired etching process. It is desired that the material has an etching rate of five times or more, more preferably ten times or more in terms of the selectivity with respect to the substrate material.

From a viewpoint of the high chemical resistance, Hf, Zr, or the like is preferable as the single metal selected from the first group. From a viewpoint of easiness in preparing the sputtering target, Al, Ti, V, or the like is preferable.

Secondly, the predetermined material may be a material (hereinafter referred to as the second material) containing at least one kind of metal selected from a group consisting of Cr, Ge, Pd, Si, Ta, Nb, Sb, Pt, Au, Po, Mo, and W and at least one kind of metal selected from the above-mentioned first group (Al, Ga, Hf, Ti, V, and Zr) (including an alloy and any other mixture). By addition of a metal selected from the first group to the metal selected from the second group, the above-mentioned material fully exhibits a resistance against the fluorine-based gas and can be etched by dry etching using a gas (e.g., the chlorine-based gas, bromine-based gas, iodine-based gas, and the like) different from the fluorine-based gas. Thus, the material can exhibit a function similar to that of the first material.

Herein, the metals specified in the second group (excluding Cr) is inferior in resistance against the fluorine-based gas to the metal specified in the first group. In case where the metal selected from the first group is added, the resistance against the fluorine-based gas is improved as compared with the case where the metal is not added. Furthermore, in case where the metal selected from the first group is added, a desired resistance against the fluorine-based gas is sufficiently exhibited. It is to be noted that Cr has a resistance against the fluorine-based gas, which is equivalent to that of the metal specified in the first group.

The metal specified in the second group is a material having an etching rate for the chlorine-based gas which is equivalent to that of the metal in the first group or which is slightly inferior to such an extent that compensation is possible by addition of the first group. As described above, the metal specified in the first group is a material which can easily be etched, for example, using the chlorine-based gas. Therefore, the material containing the metal specified in the second group and the metal specified in the first group added thereto is maintained or improved in etching characteristic for the chlorine-based gas.

Thus, the present inventors have found out that the etching characteristic with respect to the chlorine-based gas is maintained and the resistance against the fluorine-based gas is remarkably improved by adding a small amount of the metal selected from the first group to the metal selected from the second group. The added amount of the metal selected from the first group with respect to the metal selected from the second group is selected to be 2% or more. If the added amount is smaller than 2%, the characteristic of the added material is not fully exhibited and the effect of improving the resistance against the fluorine-based gas is insufficient.

Thirdly, the predetermined material may be a material containing the single metal, the first material, or the second material with nitrogen and/or carbon added thereto. Nitrogen and/or carbon is preferably contained in a range such that the desired characteristic is not impaired.

Herein, the fluorine-based gas may be $C_xF_y$ (e.g., $CF_4$, $C_2F_6$), $CHF_3$, a mixture gas thereof, or any one of these gases with $O_2$ or a rare gas (He, Ar, Xe) added as an additional gas.

Moreover, as a gas other than the fluorine-based gas, a halogen-based gas other than fluorine (chlorine-based, bromine-based, iodine-based, or a mixture gas thereof) can be used. As the chlorine-based gas, use may be made of $Cl_2$, $BCl_3$, HCl, a mixture gas thereof, or any one of these gases with a rare gas (He, Ar, Xe) added as an additional gas.

As the bromine-based gas, use may be made of $Br_2$, HBr, a mixture gas thereof, or any one of these gases with a rare gas (He, Ar, Xe) added as an additional gas. As the iodine-based gas, use may be made of $I_2$, HI, a mixture gas thereof, or any one of these gases with a rare gas (He, Ar, Xe) added as an additional gas.

Herein, it is preferable to use the chlorine-based gas as the gas different from the fluorine-based gas, because the etching rate can be increased as compared with the bromine-based gas or the iodine-based gas. It is to be noted that a gas containing both fluorine and a different gas other than fluorine can also be used. In this case, one of fluorine and the different gas which includes a greater ratio of excited species in active species in plasma is preferentially referred to.

If the excited species of fluorine is greater in ratio, the gas is defined as the fluorine-based gas. If the excited species of the different gas (e.g., chlorine) other than the fluorine-based gas is greater, the gas is defined as the different gas other than the fluorine-based gas (e.g., the chlorine-based gas). If fluorine and a different halogen element or elements are contained in a single gas composition (e.g., $ClF_3$, and the like), the gas is defined as the fluorine-based gas.

For the gas other than the fluorine-based gas, it is preferable that oxygen is not contained as the additional gas. This is because the addition of oxygen may decrease the etching rate due to surface oxidation. For example, an etching gas $Cl_2+O_2$ typically used in etching of Cr causes a complicated reaction, which tends to produce etching distribution. Therefore, it is preferable to perform the dry etching by a single-component gas such as $Cl_2$ so as to obtain a high-accuracy pattern.

Next, the function of each layer which satisfies the above-described requirement will be described.

The lower layer has a resistance against the fluorine-based gas. Even if the upper layer is dry-etched using the fluorine-based gas and the surface of the lower layer is exposed, film reduction of the lower layer is slow. Therefore, it is possible to set a sufficient over-etching time of the upper layer, considering the removal of a residual film of the upper layer as a result of the etching distribution due to the difference in density of the pattern. As a result, it is possible to form a pattern exactly reflecting a mask pattern and to improve the dimensional accuracy.

The lower layer is made of the material which can be etched by the dry etching using the gas (e.g., the chlorine-based gas) different from the fluorine-based gas (i.e., which has a certain degree of etching rate for the chlorine-based gas). Therefore, the lower layer can be dry-etched, for example, using the chlorine-based gas. Even if the surface of the transparent substrate is exposed, the surface layer of the transparent substrate is hardly etched or dug. Therefore, it is possible to avoid fluctuation in phase difference due to etching or digging of the surface layer of the substrate and variation in in-plane phase difference due to variation in etching and to achieve high controllability of the phase difference. This is because a quartz substrate often used as the substrate of the phase shift mask has a small etching rate with respect to the dry etching for removing the lower layer as compared with the material of the lower layer.

The etching rate of the lower layer with respect to the chlorine-based gas is preferably as high as possible. Although depending upon the required value of the CD dimensional accuracy and the etching conditions, it is preferable that the etching rate is not smaller than 2500 angstroms/min, 3000 angstroms/min, or 4000 angstroms/min. Specifically, the lower layer in the phase shift mask typically has an etching rate of 100 angstroms or less. Since the lower layer has a high etching rate, the etching of the lower layer comes to an end in several seconds. An over-etching time is extremely short. An etching rate of 360 angstroms/min corresponds to 6 angstroms/sec. Thus, an etched amount (removed amount) is extremely small.

Moreover, unlike the structure of the light shielding Cr layer/coating glass/thin Cr layer/transparent substrate described in conjunction with the prior art, the structure of the light shielding Cr layer/upper layer/lower layer/transparent substrate according to the present invention is advantageous in the following respects. Since the light shielding Cr layer is made of the material different from the material of the lower layer, selective operation is possible in the process of removing the light shielding Cr layer. This removing process can be performed not only by a wet process using a second ammonium solution of cerium nitrate used in common but also may be carried out using the dry etching. Thus, it is possible to avoid an adverse influence as a result of etching of the lower layer in the selective removing process of the light shielding Cr layer, regardless of wet etching or dry etching. That is, the structure of this invention is adaptable to the above-mentioned process.

During deposition of each of the lower and the upper layers, deposition may be carried out so that the film structure is an amorphous structure or a structure having extremely small grain boundaries. This contributes to the improvement of pattern accuracy. The reason is as follows. If the film structure is a columnar or a crystal structure, roughness (unevenness or irregularities) will be produced on a sidewall of the pattern during the etching. On the other hand, if the film structure is the amorphous structure or the structure having extremely small grain boundaries, the sidewall of the pattern has a generally flat surface (substantially linear) during the etching.

If the film structure is the columnar or the crystal structure, film stress may be generated to raise a problem. On the other hand, if the film structure is the amorphous structure or the structure having the extremely small grain boundaries, the film stress can easily be controlled.

In case where the upper layer of the phase shifter film is made of a Si-based material such as $SiO_x$, $SiN_x$, $SiO_xN_y$, $SiC_x$, $SiC_xN_y$, or $SiC_xO_yN_z$, or a material containing the Si-based material and a metal M (for example, at least one of Mo, Ta, W, Cr, Zr, Hf) added thereto so that $M/(Si+H) \times 100$ is preferably 10 atomic % or less, the upper layer can easily be processed by the dry etching using the fluorine-based gas and has a high resistance against the dry etching using the chlorine-based gas. In case where the upper layer is made of the above-mentioned material, it is possible to satisfy the predetermined transmittance and the predetermined phase shift amount, even if the exposure wavelength is shortened to 193 nm as the wavelength of the ArF excimer laser or 157 nm as the wavelength of the $F_2$ excimer laser. Thus, it is possible to adapt to the shortened wavelength.

For example, the phase shift mask blank has a structure of $SiO_x$ and $SiO_xN_y$ layer/the lower layer of the predetermined material (the layer having the above-described etching characteristic)/the transparent substrate. With this structure, the $SiO_x$ and $SiO_xN_y$ layer is patterned by the dry etching using the fluorine-based gas and a portion corresponding to the lower layer is processed by the dry etching using the chlorine-based gas so as to suppress the damage to an underlayer.

By the use of the blank having the above-mentioned structure, it is possible to control the optical characteristic and to achieve the phase shift effect even in a generation of the increasingly shortened wavelength. Specifically, the phase shift amount is mainly controlled by the thickness or the composition of the $SiO_x$ and $SiO_xN_y$ layer as the upper layer while the transmittance is mainly controlled by the thickness of the lower layer made of the above-described predetermined material. Thus, it is possible to control the optical characteristic.

By processing the lower layer by the dry etching using the chlorine-based gas, it is possible to prevent the transparent substrate as the underlayer from being damaged. Since the change in phase shift amount by etching or digging of the transparent substrate can be avoided, the above-described optical characteristic can be controlled. As a consequence, a predetermined phase shift effect is achieved.

In the present invention, it is preferable to form the light shielding Cr layer on the phase shift mask blank, to form the resist pattern on the shielding Cr layer to obtain a light shielding Cr pattern, and to etch the phase shifter film using a combination of the resist pattern and the light shielding Cr pattern or the light shielding Cr pattern alone as the mask. After etching the phase shifter film, the light shielding Cr pattern is left in a light shielding band portion of a non-transfer region of the phase shift mask. Alternatively, the light shielding Cr pattern is removed except an alignment mark forming portion inside and outside the transfer region or a desired region excluding the neighborhood of the boundary of the pattern, in addition to the above-mentioned light shielding band portion. The light shielding Cr layer may be a single layer film or a multilayered film containing Cr or containing Cr, oxygen, carbon, and nitrogen.

In the present invention, the refractive index of the film of the upper layer at the inspection wavelength is smaller than the refractive index of the lower layer. In this condition, it is possible to adjust the reflectance to the inspection light beam. At the exposure wavelength also, the refractive index of the film of the upper layer is smaller than the refractive index of the film of the lower layer. In this condition, it is possible to adjust the reflectance to the exposure light beam so that the reflectance has a value smaller than a required value.

Specifically, in view of the pattern transfer, it is desired that the transmittance for the exposure light beam is 3 to 20%, preferably 6 to 20% while the reflectance for the exposure light beam is 30%, preferably 20%. In view of the defect inspection of the mask using the transmitted light beam, the inspection light transmittance is preferably 40% or less. In view of the defect inspection of the mask using the transmitted light beam and the reflected light beam, it is preferable that the inspection light transmittance is 60% or less and the inspection light reflectance is 12% or more.

As the exposure light beam upon using the halftone phase shift mask of the present invention, use is particularly made of an exposure wavelength region of 140 nm to 200 nm. Specifically, use may be made of the wavelength around 157 nm which is the wavelength of the $F_2$ excimer laser and the wavelength around 193 nm which is the wavelength of the ArF excimer laser. It is also possible to prepare a high-transmittance product in which the halftone phase shifter portion has a high transmittance (8 to 30%).

In the present invention, the film design is carried out so that the upper layer serves as a layer (phase adjustment layer) exhibiting a function of mainly adjusting the phase shift amount while the lower layer serves a layer (transmittance adjustment layer) exhibiting a function of mainly adjusting the transmittance.

Specifically, assuming that the phase shift amount of the exposure light beam passing through the upper layer (phase adjustment layer) and having a wavelength λ is represented by φ (deg), the film thickness d of the phase adjustment layer is given by:

$$d=(\phi/360) \times \lambda/(n-1) \quad (3),$$

where n represents the refractive index of the phase adjustment layer with respect to the light beam having the wavelength λ.

Assuming that the phase shift amount of the lower layer (transmittance adjustment layer) is represented by φ', the phase shift amount Φ of the halftone phase shifter portion must be designed as follows:

$$\Phi=\phi+\phi'=180°$$

The value of φ' is generally falls in a range of $-20° \leq \phi' \leq 20°$. Beyond the above-mentioned range, the film thickness of the lower layer is too large and the transmittance of the exposure light beam cannot be increased. Therefore, the film thickness d of the upper layer is designed in the following range.

$$0.44 \times \lambda/(n-1) \leq d \leq 0.56 \times \lambda/(n-1) \quad (4)$$

Specifically, the film thickness of the lower layer may be 1 to 20 nm, preferably 1 to 15 nm. As a result, it is possible to reduce the film thickness of the halftone phase shifter film to 120 nm or less, more preferably to 100 nm or less.

It is to be noted that the phase shift amount of the halftone phase shifter film is ideally 180° but, practically, the range of 180°±5° is sufficient.

As the transparent substrate in the present invention, use may be made of a synthetic quartz substrate. Particularly when the $F_2$ excimer laser is used as the exposure light beam, an F-doped synthetic quartz substrate, a calcium fluoride substrate, and the like can be used.

As the material of the lower layer, it is particularly preferable to use a material substantially consisting of tantalum and hafnium or a material substantially consisting of silicon and hafnium. The material of the lower layer is resistant against the fluorine-based dry etching gas and can be removed by the chlorine-based dry etching gas. With this structure, as a method (etching method) of processing the halftone phase shifter film, the upper layer is etched by the dry etching using the fluorine-based gas while the lower layer is etched by the dry etching using the chlorine-based gas.

Specifically, tantalum or silicon, even in the form of a single metal, is a material which can be etched by the dry etching using the chlorine-based gas not damaging the transparent substrate. However, tantalum or silicon is not so superior in resistance against the dry etching of the upper layer using the fluorine-based gas.

On the other hand, the single metal of hafnium is a material which is superior in resistance against the dry etching of the upper layer using the fluorine-based gas and which can be etched by the dry etching using the chlorine-based gas. If hafnium is added to tantalum or silicon, the resistance against the dry etching using the fluorine-based gas is improved as compared with the case where hafnium is not added. In addition, the etching characteristic with respect to the chlorine-based gas can be maintained or improved. Preferably, the amount of hafnium added to tantalum or silicon is 2 atomic % or more from a viewpoint that the resistance against the fluorine-based dry etching gas is obtained.

In case where the lower layer is made of the material substantially consisting of tantalum and hafnium or substantially consisting of silicon and hafnium, the added amount of hafnium contained in the lower layer is preferably 50 atomic % or less. This is because the light semi-transmitting film containing tantalum or silicon exhibits only a small difference between the transmittance at the exposure wavelength and the transmittance at the inspection wavelength. Alternatively, this is because the transmittance at the inspection wavelength is greater than the transmittance at the exposure wavelength and such material is suitable in designing the optical characteristic (transmittance and/or reflectance of the exposure light and the inspection light). Therefore, inclusion of a sufficient amount of tantalum or silicon facilitates the design of the optical characteristic.

In the halftone phase shift mask blank and the halftone phase shift mask of the present invention, heat treatment or laser annealing may be carried out after deposition of the halftone phase shifter film. By the heat treatment, various effects, such as the relaxation of the film stress, improvement of the chemical resistance and the irradiation resistance, and fine adjustment of the transmittance. The heat treatment temperature is preferably 200° C. or more, more preferably 380° C. or more.

In the present invention, a light shielding film containing chromium as a main component may be formed on the halftone phase shifter film. The light shielding film is used as the etching mask layer for the halftone phase shifter film and is thereafter selectively removed to form a light shielding portion at a desired position or in a desired area on the halftone phase shift mask. As the light shielding film containing chromium as a main component, use may be made of a film having a single-layer or a multilayered structure (including a film having a continuous composition gradient) and containing chromium or containing oxygen, nitrogen, carbon, and/or fluorine in addition to chromium. Preferably, an antireflection film (antireflection at the exposure wavelength) containing oxygen is formed in a surface layer portion.

In case where the light shielding film containing chromium as a main component is formed on the halftone phase shifter film of the halftone phase shift mask, the light shielding film can be formed as a light shielding band to surround the transfer region. Alternatively, in order to increase the contrast of a mark such as an alignment mark, a light shielding film can be formed at a marking position. Alternatively, in order to reduce a side lobe light beam while the phase shift effect is achieved, the light shielding film can be formed in a region except the neighborhood of the boundary of the light semi-transmitting portion.

The present invention includes an embodiment utilizing the dry etching characteristic of the upper and the lower layers mentioned above and eliminating the restriction in vertical relationship and the restriction in application. Thus, the present invention is applicable to a laminate material for dry etching (laminate material before dry etching) in the art, such as an etching mask material and an etching stopper material.

The demand for the material superior in dry etching characteristic is not only restricted to the above-mentioned photo mask using the phase shift but also reaches a wide range of application, for example, as the etching stopper layer intended to protect the underlayer and the etching mask material required to have a high selectivity and a reduced thickness following miniaturization of the pattern.

In the above-mentioned embodiment, the second layer is made of a material (hereinafter referred to as a predetermined function exhibiting material) which has a high etching resistance in the dry etching using the fluorine-based gas and which can easily be etched in a condition using the chlorine-based gas. The material of the second layer contains at least one of Al, Ga, Hf, Ti, V, and Zr. The above-mentioned predetermined function is achieved by the film containing the above-mentioned element or elements or the film containing another metal and the above-mentioned element added thereto. The amount of the above-mentioned element or elements to another metal is 2% or more. If the added amount is smaller than 2%, the characteristic of the added material is not fully exhibited and the above-mentioned predetermined function is not achieved in the etching. As another metal described herein, use may be made of a material which can be etched by the chlorine-based gas. For example, another metal may be Cr, Ge, Pd, Si, Ta, Nb, Sb, Pt, Au, Po, Mo, and W.

The use of the above-mentioned materials makes it possible to perform high-selectivity etching utilizing the difference in dry etching characteristic depending upon the species of the gas. This effect also contributes to reduction in thickness of the component layer (e.g., reduction in thickness of the etching mask layer) and results in the improvement in accuracy of the fine pattern.

During deposition of each of the first and the second layers, deposition may be carried out so that the film structure is an amorphous structure or a structure having extremely small grain boundaries. This contributes to the improvement of pattern accuracy. The reason is as follows. If the film structure is a columnar or a crystal structure, roughness (unevenness or irregularities) will be produced on a sidewall of the pattern during the etching. On the other hand, if the film structure is the amorphous structure or the structure having extremely small grain boundaries, the sidewall of the pattern has a generally flat surface (substantially linear) during the etching. If the film structure is the columnar or the crystal structure, film stress may be generated to raise a problem. On the other hand, if the film structure is the amorphous structure or the structure having the extremely small grain boundaries, the film stress can easily be controlled.

The first layer in the above-mentioned embodiment also includes the case where an upper layer portion of the substrate corresponds to the first layer, i.e., the case where an etched pattern (a sinking or carved pattern) is formed in a surface layer portion of the substrate with the second layer as an etching mask layer. The laminate in the above-mentioned embodiment includes a laminate composed of the second layer and the substrate (the upper layer portion corresponds to the first layer).

DESCRIPTION OF THE PREFERRED EMBODIMENTS

Hereinafter, the present invention will be described in detail in conjunction with several examples and comparative examples. It is noted here that the present invention is not limited to the following examples.

Figure 1A:
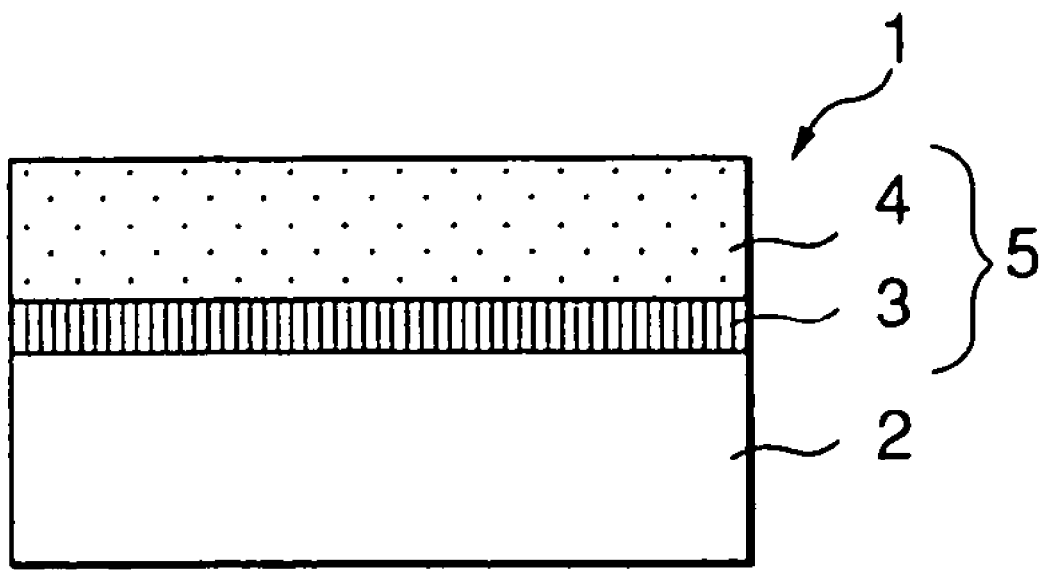
FIGS. 1A and 1B show sectional views of a halftone phase shift mask blank and a halftone phase shift mask according to an embodiment of the present invention, respectively.

Referring to FIG. 1A, a halftone phase shift mask blank 1 comprises a transparent substrate 2 and a halftone phase shifter film 5 formed on the transparent substrate 2 and including a lower layer 3 and an upper layer 4 formed on the lower layer 3.

Figure 1B:
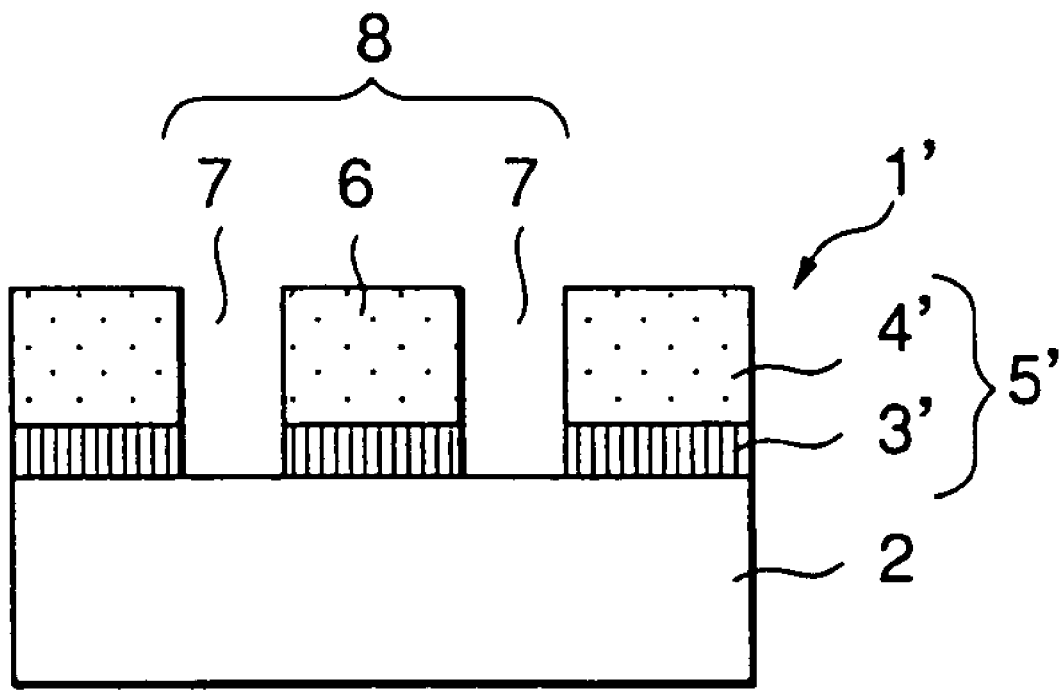

Referring to FIG. 1B, a halftone phase shift mask 1' comprises the transparent substrate 2 and a halftone phase shifter portion 5' formed on the transparent substrate 2 and including a lower layer portion 3' and an upper layer portion 4' formed on the lower layer portion 3'. With this structure, a mask pattern 8 is formed which includes a light semi-transmitting portion 6 in which the halftone phase shifter portion 5' is formed and a light transmitting portion 7 in which the halftone phase shifter portion 5' is not formed. Each of the halftone phase shifter film 5 and the halftone phase shifter portion 5' has a desired transmittance with respect to an exposure light beam and a phase shift angle of about 180 degrees. Moreover, each of the halftone phase shifter film 5 and the halftone phase shifter portion 5' is designed so that the transmittance at an inspection wavelength or the transmittance and the reflectance fall within a desired range.

Example 1

Table 1 shows the result of confirming etching characteristics of $TaZr_x$ (representing the material containing Ta and Zr and not showing the ratio of Ta and Zr: this also applies in the following) and Zr when dry etching using the fluorine-based gas or the chlorine-based gas was carried out. Table 2 shows the result of confirming etching characteristics of TaAl and TaHf when dry etching using the fluorine-based gas or the chlorine-based gas was carried out. Thus, in this example, confirmation has mainly been made of the dry etching characteristics of the film containing Ta as a main component and a material (Al, Hf, Zr) supposed to be related to the effect of the present invention.

TABLE 1

| | Zr content (%) | Etching gas | Etching rate (Å/min) | Selection ratio (/QZ) |
|---|---|---|---|---|
| TaZr$_x$ | | Cl$_2$ | 4020 | 11.2 |
| Zr | 100 | Cl$_2$ | 3370 | 9.4 |
| QZ | 0 | Cl$_2$ | 360 | — |
| TaZr$_x$ | 1.8 | C$_2$F$_6$ | 40 | 0.3 |
| TaZr$_x$ | 2.6 | C$_2$F$_6$ | 40 | 0.3 |
| TaZr$_x$ | 4.3 | C$_2$F$_6$ | 10 | 0.1 |
| Zr | 100 | C$_2$F$_6$ | 7 | 0.1 |
| QZ | 0 | C$_2$F$_6$ | 120 | — |

Each film material was deposited using the sputtering method. In order to add the material, a metal piece of the material in consideration was placed on a Ta target. Then, deposition was carried out. Whether the material was added in the film was confirmed by the use of the X-ray photoelectron spectroscopy (XPS). In the dry etching, those gases shown in Table 2 were used. In this example, the etching by a high-density plasma was performed using an inductive coupling plasma source.

TABLE 2

| | Etching gas | Etching rate (Å/min) | Selection ratio (/QZ) |
|---|---|---|---|
| TaAl | Cl$_2$ | 2880 | 11.5 |
| TaHf | Cl$_2$ | 2980 | 11.0 |
| QZ | Cl$_2$ | 260 | — |
| TaAl | C$_2$F$_6$ | 70 | 0.6 |
| TaHf | C$_2$F$_6$ | 20 | 0.2 |
| QZ | C$_2$F$_6$ | 110 | — |

As a result of the experiment, it has been confirmed that, by addition of a small amount of the materials (Al, Hf, Zr) according to the present invention, the resistance against the fluorine-based gas is improved while a chlorine-based characteristic is maintained. It has been confirmed that the Zr single metal film according to the present invention is a material which has a high etching resistance (i.e., the etching rate is low) in the dry etching using the fluorine-based gas and which can easily be etched (i.e., the etching rate is high) in the dry etching using the chlorine-based gas Comparative Example 1

In order to confirm the effect of addition in Example 1, confirmation was made, in Comparative Example 1, of the dry etching characteristic related to the Ta single metal film without addition of the above-mentioned materials. As shown in Table 3, the Ta single metal film was insufficient in selectivity with the quartz substrate with respect to the fluorine-based gas. The etching condition in this comparative example was similar to that in Example 1.

TABLE 3

| | Etching gas | Etching rate (Å/min) | Selection ratio (/QZ) |
|---|---|---|---|
| Ta | Cl$_2$ | 2900 | 8.1 |
| QZ | Cl$_2$ | 360 | — |
| Ta | C$_2$F$_6$ | 110 | 0.9 |
| QZ | C$_2$F$_6$ | 120 | — |

Example 2

In this example, a SiON layer was processed with a Zr film used as an etching mask.

Figure 2A:
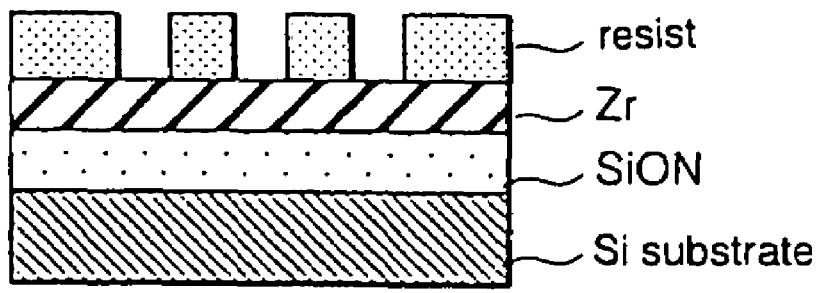
FIGS. 2A through 2D are views for describing a sequence of steps of processing each layer in Example 2.
Figure 2B:
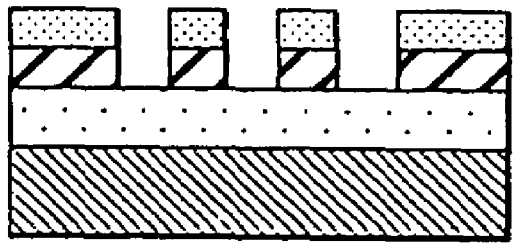
Figure 2C:
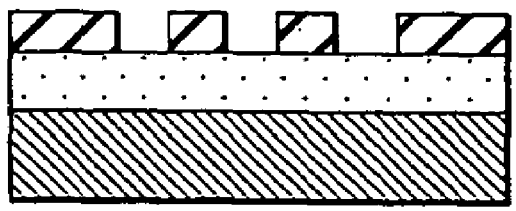
Figure 2D:
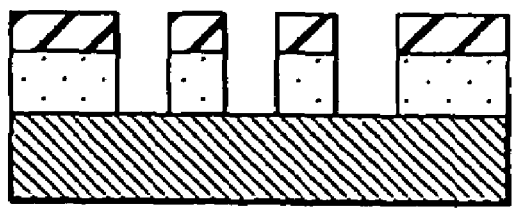

The film structure was resist/Zr/SiON (FIG. 2A). Each layer deposited on the Si substrate was processed and the effect as the etching mask material was confirmed. In this example, the film thickness of each layer was as follows. The Zr layer had a thickness of 200 angstroms and the SiON layer had a thickness of 800 angstroms. After the Zr layer was processed by the chlorine gas with the resist pattern as the mask (FIG. 2B), the SiON layer was processed. Then, the residual film of the Zr layer was measured. As a result, the residual film of 60% or more was confirmed. It has been revealed that the sufficient dry etching resistance as the etching mask material was exhibited.

Example 3

In this example, preparation was made of a photo mask having a phase shift effect. Herein, blanks having a structure of SiON/TaZr/QZ substrate were finely processed taking the selectivity between the materials into consideration.

Figure 3A:
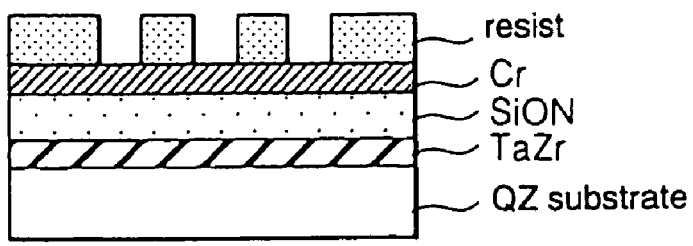
FIGS. 3A through 3E are views for describing a sequence of steps of processing each layer in Example 3.

For the two-layer film on the QZ substrate, RF magnetron sputtering was performed to deposit the SiON layer of about 800 angstroms and the TaZr layer of about 60 angstroms. For patterning (or for formation of the light shielding Cr layer), the Cr film of about 500 angstroms was deposited on the SiON layer. Thereafter, a ZEP resist for an electron beam was applied. Through an electron beam drawing step and a developing step, a test pattern having a width of 0.5 μm was formed (FIG. 3A).

Herein, the film thickness of each layer was selected with reference to the phase difference of the light beam transmitted through the mask.

Figure 3B:
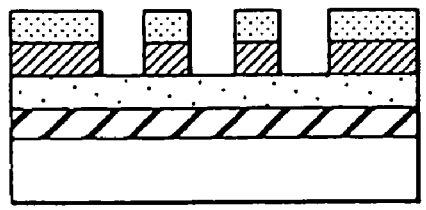

Based on the resist pattern, Cr processing was performed in a mixed gas of chlorine and oxygen (oxygen ratio of about 20%) (FIG. 3B).

Figure 3C:
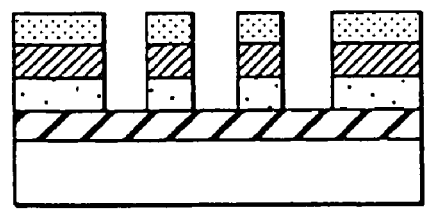
Figure 3D:
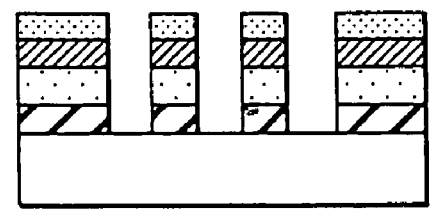
Figure 3E:
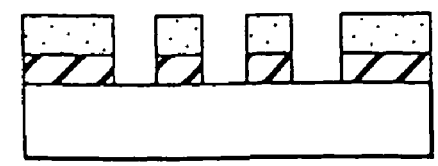

Thereafter, the SiON layer was processed using a C$_2$F$_6$ gas (FIG. 3C). Then, the TaZr layer was etched by the chlorine gas (FIG. 3D). The Cr layer (including the resist film) was removed (or selectively removed leaving the light shielding band portion) by a wet process mainly using the cerium nitrate second ammonium solution (FIG. 3E). Thus, a desired test pattern was formed.

For patterning, the high-density plasma etching apparatus using the inductive coupling plasma source was used. The section of the processed pattern shape was observed by the use of a scanning electron microscope (SEM). As a result, formation of an excellent pattern without etching or digging into the QZ substrate was confirmed.

For a sample in which processing was stopped when the SiON layer was formed, pattern observation was similarly carried out. As a result, no substantial film reduction of the TaZr layer has been confirmed. Taking the distribution into consideration, the over-etching time was added to the predetermined dry etching time. In this manner, pattern formation without the residual film of the SiON layer was realized. Furthermore, side etching of the TaZr layer by the removal of the Cr layer was not recognized.

Comparative Example 2

Figure 4A:
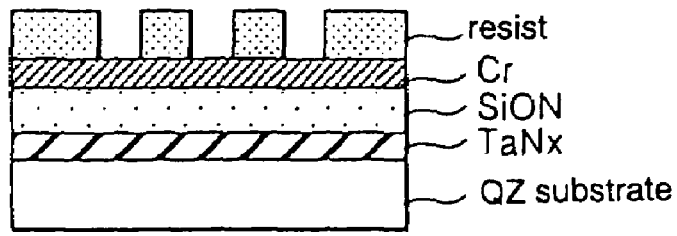
FIGS. 4A through 4E are views for describing a sequence of steps of processing each layer in Comparative Example 2.
Figure 4B:
Figure 4B:
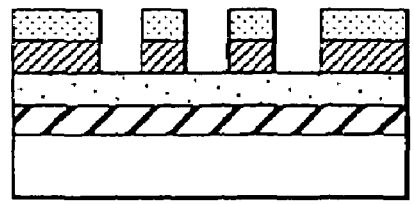
Figure 4C:
Figure 4C:
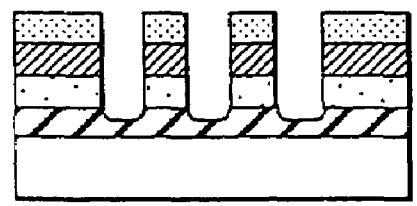
Figure 4D:
Figure 4D:
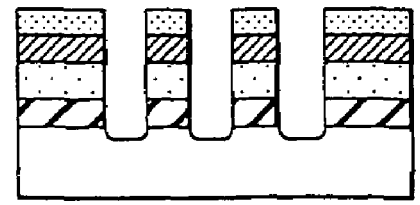
Figure 4E:
Figure 4E:
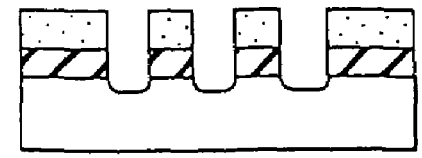

In this comparative example, the TaZr layer in Example 2 is replaced by TaN which is close in etching resistance for the fluorine-based gas to the SiON layer. Except that the material on the QZ substrate was changed, the processing similar to that of Example 3 was performed. The TaN film was deposited by the reactive sputtering using a mixed gas of argon and nitrogen. Specifically, processing of Cr was performed based on the resist pattern (FIGS. 4A and 4B). Thereafter, the SiON layer was processed using the $C_2F_6$ gas (FIG. 4C). Then, the TaN layer was etched by the chlorine gas (FIG. 4D). The Cr layer (including the resist film) was removed by the wet process mainly using the cerium nitrate second ammonium solution (FIG. 4E). Thus, the predetermined test pattern was formed.

In the manner similar to Example 2, the 0.5 μm test pattern was formed. As a result, an excellent shape of the pattern was obtained like in the foregoing example. However, etching or digging into the underlying QZ substrate was confirmed. The etching rate of the TaN film by the fluorine-based gas was substantially equivalent to that of QZ.

Example 4

In this example, processing similar to that in Example 2 was performed except that the TaZr layer was replaced by the Hf layer and the Zr layer.

In the similar manner, a fine pattern was formed and the pattern shape was observed by SEM. As a result, it has been confirmed that the pattern similar in level to that of Example 3 was formed. No substantial difference was observed for the damage of the QZ substrate. It has been confirmed that excellent pattern formation was carried out.

Examples 5-10 & Comparative Examples 3-5

In Examples 5 to 7, 10 and Comparative Examples 3 to 5, the phase shift mask blank and the phase shift mask were prepared using the $F_2$ excimer laser (wavelength of 157 nm) for the exposure light beam and the light beam having a wavelength of 257 nm as the inspection light beam. In Examples 8 and 9, the phase shift mask blank and the phase shift mask were prepared using the ArF excimer laser (wavelength of 193 nm) for the exposure light beam and the light beam having a wavelength of 364 nm as the inspection light beam.

Next referring to FIGS. 5A to 5D and 6A to 6D, description will be made of a manufacturing process of the present invention.

First, the lower layer 3 was deposited on the transparent substrate 2 of synthetic quartz by the use of the DC magnetron sputtering apparatus with the target having the composition shown in Table 4 (in Comparative Examples 3 and 5, single elements of tantalum and silicon, respectively) and the rare gas (argon gas) as a sputtering gas.

Figure 5A:
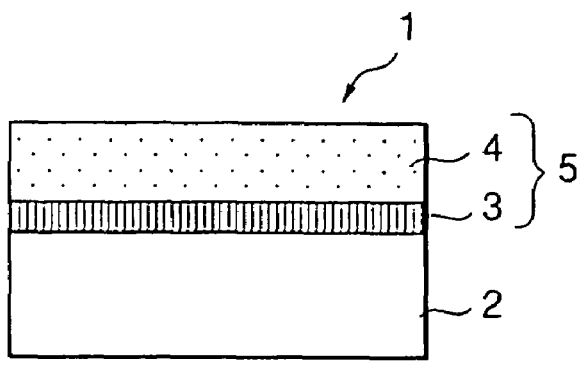
FIGS. 5A through 5D are views for describing a first half of a manufacturing process of a halftone phase shift mask blank and a halftone phase shift mask in each of Examples 5 through 10 and Comparative Examples 3 through 5.
Figure 5B:
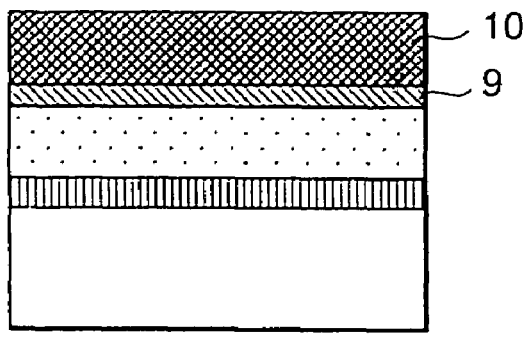

Next, by the use of the DC magnetron sputtering apparatus, the SiON film as the upper layer 4 was deposited on the lower layer 3 by the reactive sputtering method using Si as the target and Ar, $O_2$, and $N_2$ as the sputtering gas (FIG. 5A).

Next, the halftone phase shift mask blank obtained as described above was heat-treated at 400° C. for one hour.

Figure 5C:
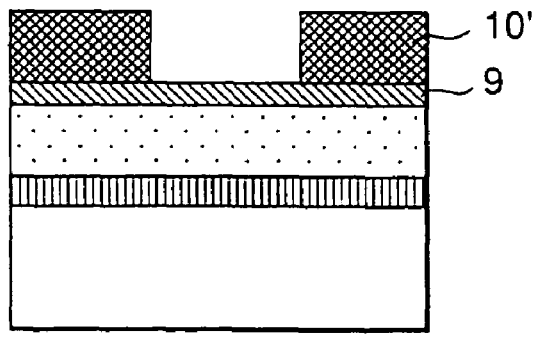

Thereafter, a light shielding film 9 containing chromium as a main component and an electron beam drawing resist 10 were successively laminated on the two-layer film mentioned above (FIG. 5B). Then, pattern was drawn on the resist by the electron beam, followed by development by dipping and baking. Thus, a resist pattern 10' was formed (FIG. 5C).

Figure 5D:
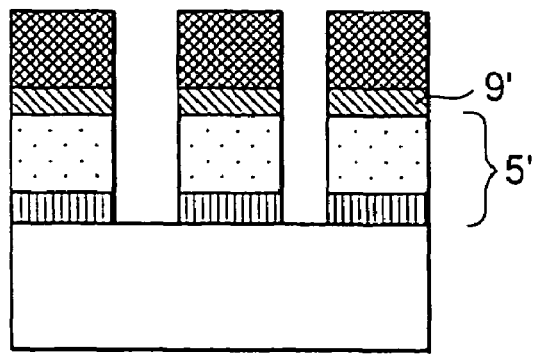

Subsequently, with the resist pattern used as a mask, a light shielding band film pattern 9' was formed by the dry etching using a $Cl_2+O_2$ gas. After changing the gas, the pattern of the halftone phase shifter portion was formed. In this step, $CH_4+O_2$ was used to etch the upper layer 4 and the $Cl_2$ gas was used to etch the lower layer 3 (FIG. 5D). In Comparative Example 3, however, the lower layer was also etched by $CH_4+O_2$ and, therefore, etching using $Cl_2$ gas was not performed.

Figure 6A:
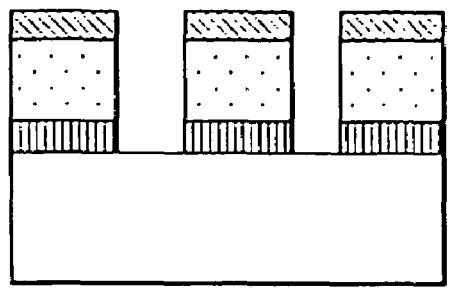
FIGS. 6A through 6D are views for describing a second half of the manufacturing process following the first half in FIGS. 5A through 5D.
Figure 6B:
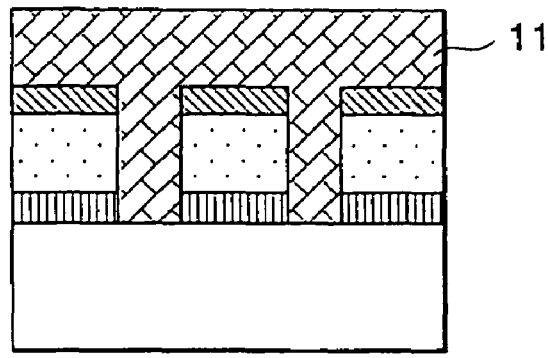
Figure 6C:
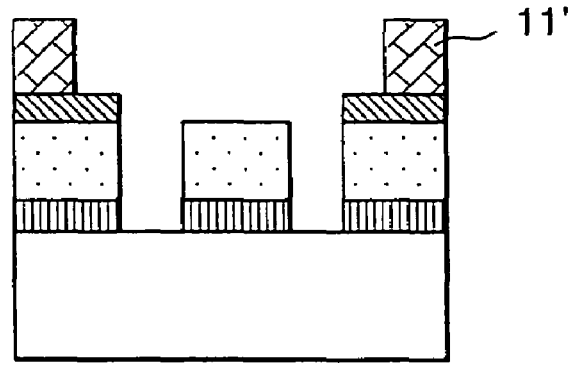
Figure 6D:
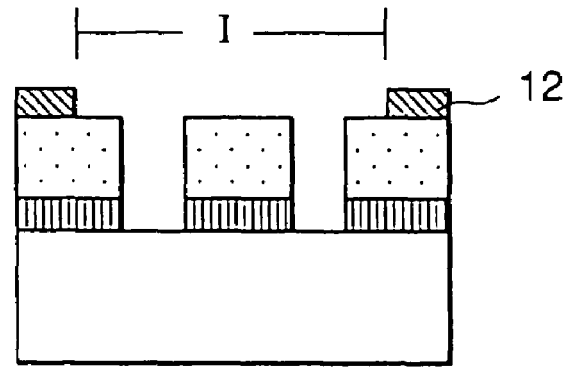

Next, the resist on the resultant pattern was peeled off and removed (FIG. 6A). Again, the whole surface was coated with a resist 11 (FIG. 6B). Thereafter, through a laser drawing and development process, a resist pattern 11' was formed (FIG. 6C). Subsequently, a light shielding band 12 was formed by the wet etching in a non-transfer region except a transfer region 1. Next, the resist pattern was peeled of and removed. Thus, the halftone phase shift mask was obtained (FIG. 6D).

The material of the transparent substrate, the composition of the upper layer, the film thickness, the optical characteristics of the exposure light beam and the inspection light beam, the etching characteristics, and the like are shown in Tables 4 to 7. The composition of the lower layer is substantially same as that of the target.

Figure 7:
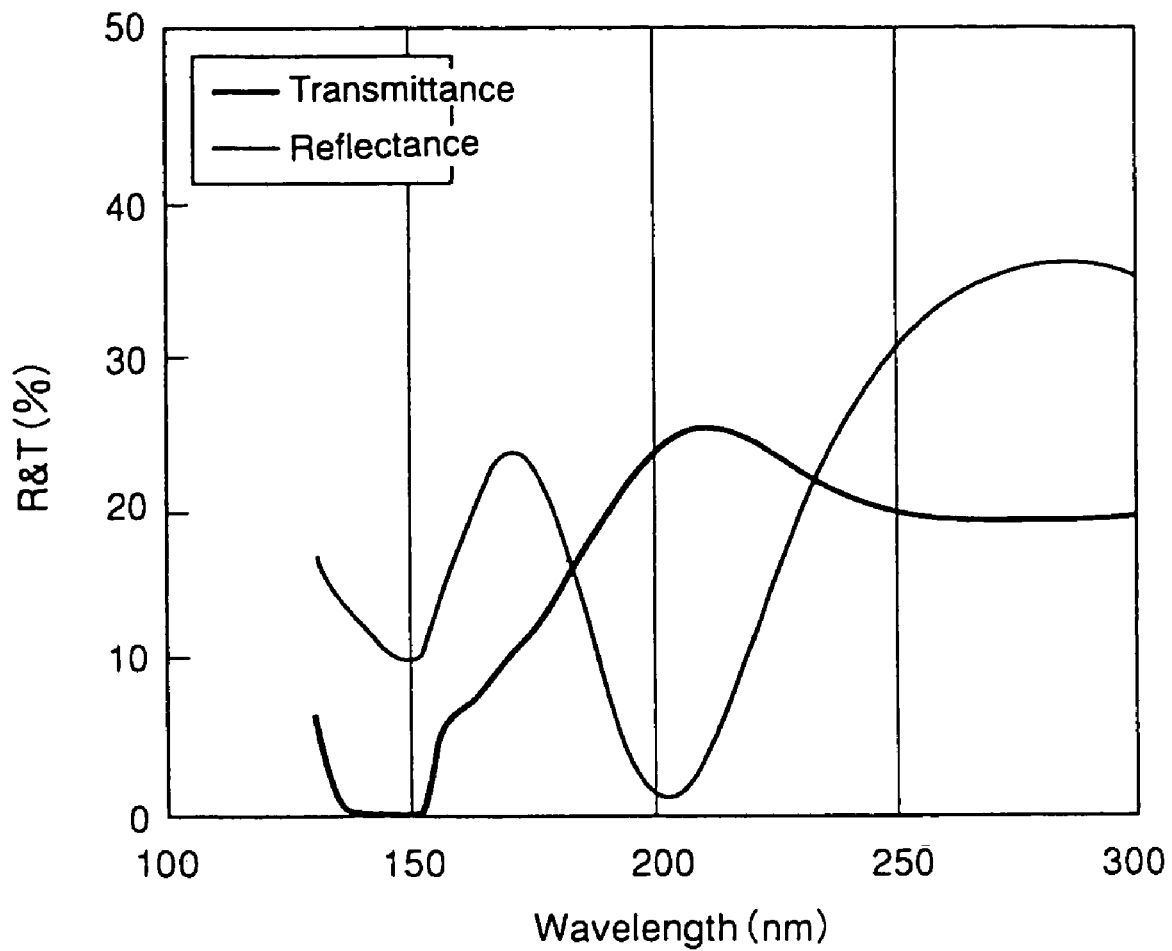
FIG. 7 is a spectrum diagram of an optical characteristic of the halftone phase shift mask blank in Example 5.
Figure 8:
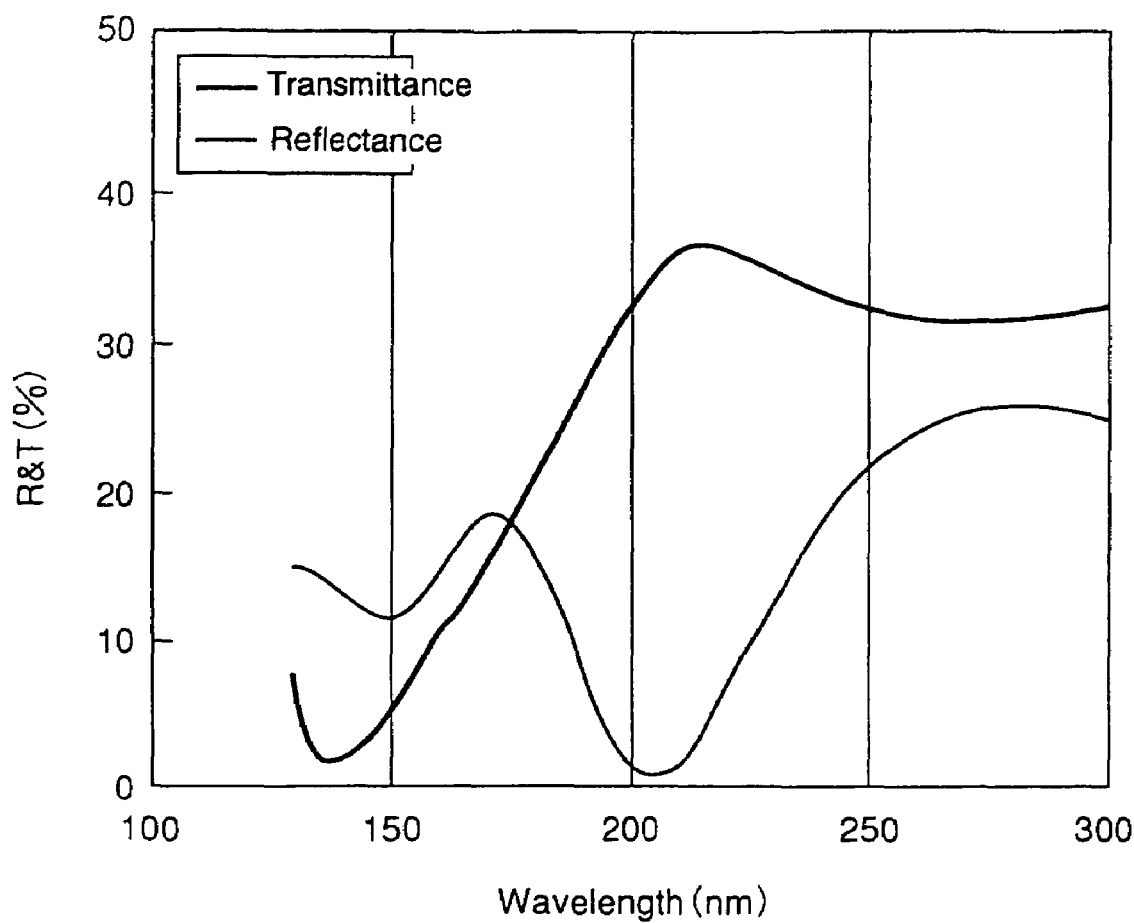
FIG. 8 is a spectrum diagram of the optical property of the halftone phase shift mask blank in Example 6.

FIGS. 7 and 8 show transmittance and reflectance curves with respect to the wavelengths in Examples 5 and 6, respectively. In Examples 5 and 6, for the transmittances with respect to the exposure light beam ($F_2$ excimer laser) a standard product (6%) and a high-transmittance product (around 9%) were realized. The reflectance for the exposure light beam was low and satisfied a required range (20% or less). The transmittance for the inspection light beam was also lower than an upper limit of the required value (40% or less). Thus, these examples were sufficiently adapted for the inspection.

TABLE 4

| | | Transparent substrate | Upper layer material | Upper layer film thickness (Å) | Lower layer material | Lower layer film thickness (Å) | Exposure wavelength (nm) | Exposure wavelength transmittance (%) | Exposure wavelength reflectance (%) | Inspection wavelength (nm) | Inspection wavelength transmittance (%) | Inspection wavelength reflectance (%) |
|---|---|---|---|---|---|---|---|---|---|---|---|---|
| Example | 5 | F doped synthetic quartz | SiON① | 790 | Ta—Hf① | 100 | 157 | 6.20 | 15.60 | 257 | 19.91 | 32.79 |
| | 6 | $CaF_2$ | SiON① | 800 | Ta—Hf① | 65 | 157 | 9.14 | 13.55 | 257 | 32.39 | 24.78 |
| | 7 | F doped synthetic quartz | SiON① | 810 | Ta—Hf② | 35 | 157 | 14.0 | 12.00 | 257 | 49.30 | 16.80 |
| | 8 | Synthetic quartz | SiON② | 740 | Ta—Hf① | 75 | 193 | 15.1 | 17.00 | 364 | 30.40 | 21.50 |

TABLE 4-continued

|  | | Transparent substrate | Upper layer material | Upper layer film thickness (Å) | Lower layer material | Lower layer film thickness (Å) | Exposure wavelength (nm) | Exposure wavelength transmittance (%) | Exposure wavelength reflectance (%) | Inspection wavelength (nm) | Inspection wavelength transmittance (%) | Inspection wavelength reflectance (%) |
|---|---|---|---|---|---|---|---|---|---|---|---|---|
| | 9 | Synthetic quartz | SiON④ | 960 | Hf—Si | 100 | 193 | 15.83 | 18.58 | 364 | 19.6 | 38.89 |
| | 10 | CaF₂ | SiON③ | 920 | Hf—Si | 40 | 157 | 11.35 | 9.28 | 257 | 46.58 | 17.83 |
| Comparative-Example | 3 | F doped synthetic quartz | SiON④ | 770 | Ta | 60 | 157 | 7.33 | 14.37 | 257 | 35.4 | 24.06 |
| | 4 | F doped synthetic quartz | SiON③ | 807 | TaCr | 80 | 157 | 6.30 | 18.20 | 257 | 29.40 | 25.13 |
| | 5 | F doped synthetic quartz | SiON④ | 790 | Si | 40 | 157 | 9.76 | 11.95 | 257 | 43.4 | 16.93 |

TABLE 5

| | 157 nm | | 193 nm | | Composition (atomic %) | | |
|---|---|---|---|---|---|---|---|
| | n | k | n | k | Si | O | N |
| SiON | 2.00 | 0.20 | — | — | 36 | 48 | 16 |
| SiON | — | — | 2.22 | 0.18 | 40 | 27 | 33 |
| SiON | 2.05 | 0.22 | — | — | 36 | 46 | 18 |
| SiON | 2.17 | 0.30 | 2.05 | 0.10 | 38 | 38 | 24 |

TABLE 6

| | Ta | Hf | Si | Cr | Zr |
|---|---|---|---|---|---|
| Ta—Hf | 90 | 10 | | | |
| Ta—Hf | 80 | 20 | | | |
| Hf—Si | | 17 | 83 | | |
| Ta—Cr | 96 | | | 4 | |

TABLE 7

| | | Etching selection ratio of lower layer to upper layer (SF₆ + He) | Etching selection ratio of lower layer to substrate (Cl₂) |
|---|---|---|---|
| Example | 5 | 0.25 | >5 |
| | 6 | 0.25 | >5 |
| | 7 | 0.08 | >5 |
| | 8 | 0.25 | >5 |
| | 9 | 0.17 | >5 |
| | 10 | 0.17 | >5 |
| Comparative Example | 3 | 0.67 | >5 |
| | 4 | 0.25 | 2.50 |
| | 5 | 8.08 | — |

In Example 7, high transmittance (around 15%) with respect to the exposure light beam ($F_2$ excimer laser) was realized. The reflectance of the exposure wavelength was low and satisfied the required range (20% or less). The transmittance for the inspection wavelength was slightly high. However, this example satisfied the required values (transmittance of 60% or less, reflectance of 10% or more) required to perform the inspection using the transmitted light beam and the reflected light beam. Thus this example was sufficiently adapted for the inspection using the transmitted light beam and the reflected light beam.

In Example 8, high transmittance (around 15%) was realized. The reflectance for the exposure wavelength was low and satisfied the required range (20% or less). The transmittance for the inspection light beam was also lower than the upper limit of the required value (40% or less). Thus, this example was sufficiently adapted for the inspection.

In Examples 9 and 10, TaHf as the material of the lower layer in Examples 5 to 8 was replaced by HfSi. In Example 9, high transmittance (around 15%) with respect to the exposure light beam (ArF excimer laser) was realized. In Example 10, a high-transmittance product (around 11%) with respect to the exposure light beam ($F_2$ excimer laser) was realized. The reflectance of the exposure wavelength was low and satisfied the required range (30% or less). The transmittance for the inspection light beam was also lower than the upper limit of the required value (40% or less). Thus, these examples were sufficiently adapted for the inspection.

In any one of Examples 5 to 10 described above, the lower layer is small in etching selectivity with respect to an $SF_6$+He dry etching gas as compared with the upper layer. Furthermore, the lower layer exhibits a sufficient resistance against the etching of the upper layer. The lower layer has a large etching selectivity with respect to a $Cl_2$ dry etching gas as compared with the transparent substrate. Thus, the damage upon the transparent substrate during removal of the lower layer is suppressed. Therefore, it was possible to form the halftone phase shift mask which was extremely excellent in sectional shape and minimized in change of the optical characteristic due to over-etching of the transparent substrate.

In Comparative Examples 3 and 5, single elements of tantalum and silicon were used as the material of the lower layer without containing hafnium, respectively. In these comparative examples, the lower layer has a large etching selectivity for the $CH_4$+$O_2$ dry etching gas as compared with the upper layer. Furthermore, even if the upper layer is dry etched using the fluorine-based gas and the surface of the lower layer is exposed, film reduction of the lower layer is fast. As a result, it is difficult to determine a sufficient over-etching time considering the removal of the residual film of the upper layer due to the etching distribution caused by the difference in density of the pattern.

Thus, if the sufficient over-etching is not performed, the pattern having an excellent sectional shape cannot be formed. If the sufficient over-etching is performed, the lower layer is also etched and the transparent substrate is also dug so that the optical characteristic inevitably changes.

In Comparative Example 1, the sufficient over-etching of the upper layer was not performed. As a result, the pattern having an excellent sectional shape was not obtained. In Comparative Example 3, the lower layer has a very large etching selectivity with respect to the $CH_4+O_2$ dry etching gas as compared with the upper layer. As a result of the sufficient over-etching of the upper layer, the transparent substrate was also dug, and the phase shift amount inevitably changed.

In Comparative Example 2, the etching selectivity with respect to the $Cl_2$ dry etching gas was small. Therefore, the damage upon the substrate was heavy during removal of the lower layer and the optical characteristic was inevitably changed.

Figure 9:
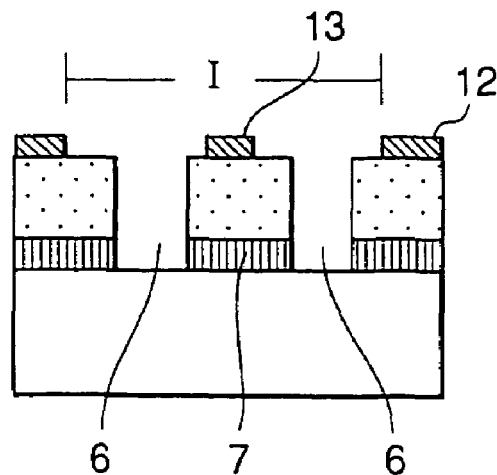
FIG. 9 is a view showing a modification of the halftone phase shift mask blank and the halftone phase shift mask according to the embodiment of the present invention.

Referring to FIG. 9, the light shielding film is formed on the halftone phase shifter portion of the halftone phase shift mask in a different manner. Specifically, a light shielding layer 13 is formed in a desired region except in the vicinity of the boundary between the light semi-transmitting portion 6 and the light transmitting portion 7. By forming the shielding layer 13 in the above-mentioned manner, the phase shift effect is obtained and a side robe light beam can be reduced. In case where the transmittance of the halftone phase shifter portion is high, an influence of the side robe light beam is problematic. Therefore, the above-mentioned structure is effective especially for the high-transmittance product (transmittance of the halftone phase shifter portion is 8 to 30%).

According to the present invention, it is possible to obtain a halftone phase shift mask blank and a halftone phase shift mask superior in fine workability during etching for forming a halftone phase shifter portion.

With an exposure light source having a shortened wavelength, especially in an exposure wavelength region of 140 nm to 200 nm, a high-transmittance product (transmittance of 8 to 30%) at the wavelength around 157 nm as the wavelength of an $F_2$ excimer laser and around 193 nm as the wavelength of an ArF excimer laser is usable.

As a result, by the use of the halftone phase shift mask of the present invention, a high-accuracy transfer pattern can be transferred.

What is claimed is:

1. A halftone phase shift mask blank for use in manufacturing a halftone phase shift mask comprising a transparent substrate, a light transmitting portion formed on the substrate for transmitting an exposure light beam, a phase shifter portion formed on the substrate for transmitting a part of the exposure light beam as a transmitted light beam and for shifting a phase of the transmitted light beam by a predetermined amount, the halftone phase shift mask being designed so that light beams passing through the light transmitting portion and through the phase shifter portion cancel each other in the vicinity of a boundary portion therebetween, thereby keeping a predetermined contrast at a boundary portion of an exposure pattern to be transferred onto the surface of an object to be exposed, wherein:

the halftone phase shift mask blank comprises a phase shifter film for forming the phase shifter portion on the transparent substrate;

the phase shifter film comprises an upper layer made of a material substantially consisting of silicon, oxygen, and nitrogen and a lower layer made of a material substantially consisting of tantalum and hafnium.

2. The halftone phase shift mask blank according to claim 1, wherein:

the content of hafnium in the lower layer is in a range of 2 to 50 atomic % or more.

3. The halftone phase shift mask blank according to claim 1, wherein:

the upper layer made of the material substantially consisting of silicon, oxygen, and nitrogen contains 35 to 45% silicon, 1 to 60% oxygen, and 5 to 60% nitrogen in atomic percentage.

4. A halftone phase shift mask comprising a transparent substrate having a mask pattern formed thereon and including a light transmitting portion and a light semi-transmitting portion, the mask pattern being formed by etching the phase shifter film in the halftone phase shift mask blank according to claim 1.

5. A method of manufacturing the halftone phase shift mask according to claim 4, comprising the steps of:

etching the upper layer by dry etching using a fluorine-based gas, and etching the lower layer by dry etching using a chlorine-based gas.

* * * * *